(12) United States Patent
Kimura et al.

(10) Patent No.: US 6,316,860 B1
(45) Date of Patent: Nov. 13, 2001

(54) SURFACE ACOUSTIC WAVE DEVICE, AND ITS FABRICATION PROCESS

(75) Inventors: Noritoshi Kimura, Chiba; Masahiro Nakano, Saitama; Katsuo Sato, Chiba, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/317,199

(22) Filed: May 24, 1999

Related U.S. Application Data

(63) Continuation of application No. PCT/JP98/02981, filed on Jul. 2, 1998.

(30) Foreign Application Priority Data

Sep. 22, 1997 (JP) .................................................. 9-275173
Oct. 1, 1997 (JP) .................................................. 9-284443

(51) Int. Cl.$^7$ .................................................. H01L 41/08
(52) U.S. Cl. .................................. 310/313 A; 310/313 R; 310/364
(58) Field of Search .......................... 310/313 R, 313 A, 310/313 B, 363, 364

(56) References Cited

U.S. PATENT DOCUMENTS

| | | |
|---|---|---|
| 5,152,864 | 10/1992 | Ieki et al. . |
| 5,162,690 | * 11/1992 | Ieki et al. .................... 310/364 X |
| 5,558,711 | 9/1996 | Sakurai . |

FOREIGN PATENT DOCUMENTS

| | | |
|---|---|---|
| 0 785 299 | 7/1997 | (EP) . |
| 55-49014 | 4/1980 | (JP) . |
| 59-55615 | 3/1984 | (JP) . |
| 64-80113 | 3/1989 | (JP) . |
| 1-128607 | 5/1989 | (JP) . |
| 4-10625 | 1/1992 | (JP) . |
| 5-90268 | 4/1993 | (JP) . |
| 5-183373 | 7/1993 | (JP) . |
| 5-199062 | 8/1993 | (JP) . |
| 5-226337 | 9/1993 | (JP) . |

(List continued on next page.)

OTHER PUBLICATIONS

J.I. Latham, et al., Thin Solid Films, vol. 64, pp. 9–15, "Improved Metallization for Surface Acoustic Wave Devices", 1979.

A. Kamijo, et al., J. Appl. Phys., vol. 77, No. 8, pp. 3799–3804, "A Highly Oriented Al[111] Texture Developed on Ultrathin Metal Underlayers", Apr. 15, 1995.

A. Sakurai, et al., Jpn. J. Appl. Phys. vol. 31, Part I, No. 9B, pp. 3064–3066, "Epitaxially Grown Al Electrodes for High–Power Surface Acoustic Wave Devices", Sep., 1992.

(List continued on next page.)

*Primary Examiner*—Mark O. Budd
(74) *Attorney, Agent, or Firm*—Oblon, Spivak, McClelland, Maier & Neustadt, P.C.

(57) ABSTRACT

The surface acoustic wave device of the invention comprises a piezoelectric substrate made up of 64° rotated Y-cut lithium niobate (64LN) or 36° rotated Y-cut lithium tantalate (36LT) and an interdigital electrode formed thereon. The interdigital electrode comprises a titanium buffer metal film and an aluminum film formed thereon. On the 64LN substrate, both the titanium buffer metal film and the aluminum film are converted into a single-crystal film that manifests itself in a spot form alone upon selected-area electron diffraction. By forming the aluminum film on the 36LT substrate with the titanium buffer metal film located therebetween, it is possible to obtain a high-orientation, polycrystalline aluminum film oriented in the (111) direction. The aluminum film is made up of a single-crystal film or a high-orientation polycrystalline film oriented in the (111) direction, whereby migration of aluminum atoms is inhibited, resulting in a power-durability improvement.

8 Claims, 11 Drawing Sheets

FOREIGN PATENT DOCUMENTS

| | | |
|---|---|---|
| 6-132777 | 5/1994 | (JP) . |
| 7-135443 | 5/1995 | (JP) . |
| 7-107967 | 11/1995 | (JP) . |
| 8-154030 | 6/1996 | (JP) . |
| 2545983 | 8/1996 | (JP) . |
| 2555072 | 8/1996 | (JP) . |
| 8-204483 | 8/1996 | (JP) . |
| 8-288782 | 11/1996 | (JP) . |
| 9-199969 | 7/1997 | (JP) . |

OTHER PUBLICATIONS

A. Sakurai, et al., Jpn. J. Appl. Phys. vol. 33, Part 1, No. 5B, pp. 3015–3017, "Epitaxially Grown Aluminum Film on 36°–Rotated Y–Cut Lithium Tantalate for High–Power Surface Acoustic Wave Devices", May, 1994.

A. Sakurai, et al., Jpn. J. Appl. Phys. vol. 34, Part 1, No. 5B, pp. 2674–2677, "Epitaxially Grown Aluminum Film On Rotated Y–Cut Lithium Niobate for High–Power Surface Acoustic Wave Devices", May, 1995.

N. Kimura, et al., Jpn. J. appl. Phys., vol. 36, Part 1, No. 5B, pp. 3101–3106, "The Power Durability of 900MHz Band Double–Mode–Type Surface Acoustic Wave Filters and Improvement on Power Durability of Al–Cu Thin Film Electrodes by Cu Atom Segregation", May, 1997.

* cited by examiner

AXIS OF INCIDENCE OF
ELECTRON BEAM [110]

AXIS OF INCIDENCE
OF ELECTRON
BEAM [001]

|←——————|
 1 μm

|⊢——⊣|
0.5 μm

|⊢——⊣|
0.5 μm

SURFACE ACOUSTIC WAVE DEVICE, AND ITS FABRICATION PROCESS

This application is a continuation of PCT/JP98/02981 filed Jul. 2, 1998.

ART FIELD

The present invention relates generally to a surface acoustic wave device, and its fabrication process, and more specifically to a surface acoustic wave device comprising a electrode film having improved power-durability, and its fabrication process.

BACKGROUND ART

Surface acoustic wave devices, i.e., surface acoustic wave filters or surface acoustic wave resonators are now increasingly used as an alternative to dielectric filters for RF-band filters used with mobile communications equipment such as portable telephones and cordless telephones. One reason for this is that a surface acoustic wave device, especially a surface acoustic wave filter is smaller in size than a dielectric filter. Another reason is that the surface acoustic wave filter is superior in electrical performance to the dielectric filter, if they are of the same size.

A surface acoustic wave device is made up of, at least, a piezoelectric substrate, a comb form of metal film electrode pattern formed on the surface of the piezoelectric substrate, and a package for housing both the piezoelectric substrate and the electrode pattern therein. Lithium niobate, lithium tantalate, quartz, etc. are used for the piezoelectric substrate. Lithium niobate, and lithium tantalate having a large electromechanical coupling coefficient are used especially for RF-band filters. Aluminum, etc. are used for the electrode pattern.

FIG. 13 illustrates a general process sequence of steps of fabricating a prior art surface acoustic wave device. At a step (b), a metal film 51 for an electrode material is first formed as by vapor deposition or sputtering on a piezoelectric substrate 50 pre-washed at a step (a). Following this, a photoresist is coated on the metal film 51 as by spin coating. Then, the photoresist is exposed to light according to a desired pattern using an exposure system, and developed to obtain a photoresist pattern 52, as depicted at a step (c). Thereafter, the metal film is etched, either wet or dry, at a step (c) into a desired electrode pattern 53. The photoresist used for pattern formation is removed at a step (e) using a stripping solution or by means of an ashing process. Thus, the pre-process called a photo-process finishes. After this, the piezoelectric substrate with the electrode pattern formed thereon is diced at a step (f) into individual chips. Then, each chip is fixed at a step (g) to a package using an bonding agent, after which bonding wires are interconnected at a step (h). Finally, a lid is welded at a step (i) to the package for ensuring airtightness, followed by performance inspection at a step (j). Thus, the so-called post-process comes to an end.

A problem with the surface acoustic wave device when used at an RF-band of about 1 GHz is that the lifetime becomes short because the electrode finger width of the comb electrode and the space between electrode fingers become as fine as about 1 μm. A key determinant of the lifetime of the surface acoustic wave device is the power-durability of the electrode film. At the beginning, aluminum or Al was used for the reasons of its small specific gravity, and its low electric resistance. However, a problem with using aluminum for the electrode film is that the degradation of the electrode film becomes more pronounced as the applied frequency becomes higher. When the surface acoustic wave device is in operation, repetitive stress proportional to frequency is applied on the electrode film on the piezoelectric substrate. The repetitive stress applied on the electrode film gives rise to migration of aluminum atoms, which in turn causes electrode film defects such as hillocks, and voids, resulting in some considerable degradation of the performance of the surface acoustic wave device. The degradation of the electrode film becomes more pronounced as the applied frequency becomes higher and the applied power becomes larger. In view of design consideration, the higher the frequency, the thinner the electrode film and the narrower the electrode width should be. Because of these and other factors, the electrode film is more likely to have defects as the applied frequency become higher. In other words, the power-durability of the surface acoustic wave device becomes low.

As an approach to reducing or preventing the degradation of the electrode film due to the migration of aluminum atoms, J. I. Latham et al have disclosed the use of an aluminum-copper (Al—Cu) alloy obtained by adding to aluminum a trace amount of a different type metal such as copper (Cu) (Thin Solid Films, 64, pp. 9–15, 1979), and showed that by use of such an aluminum alloy it is possible to prevent occurrence of hillocks or voids on the electrode film and so improve the power-durability of a surface acoustic wave device.

Other examples of improving the power-durability of electrodes by using aluminum alloys obtained by adding to aluminum trace amounts of different types of metals are disclosed in many publications inclusive of JP-B 7-107967 (Al—Ti alloy), U.S. Pat. No. 2,555,072 (Al—Ge alloy), and JP-A's 64-80113 (Al—Cu—Mg alloy) and 1-128607 (Al—Zn alloy). In any case, a trace amount of different metal is added to aluminum, so that the migration of aluminum atoms is inhibited, thereby preventing degradation of the electrode. However, the addition of a different metal to aluminum is not preferable for the reason that an inevitable increase in the electric resistance of the electrode film result in an increased loss in the surface acoustic wave device.

Incidentally, it is considered that the rate of diffusion of aluminum atoms is faster at grain boundaries than in crystal grains; that is, grain boundary diffusion occurs preferentially. It is thus believed that the migration of aluminum atoms due to repetitive stress applied on a surface acoustic wave device occurs predominantly at grain boundaries, as pointed out so far in the art.

FIG. 10 is a scanning electron microscope photograph showing how an aluminum electrode film is degraded due to repetitive stress applied on a surface acoustic wave device. The fact that voids are found at grain boundaries of the aluminum electrode film supports that the migration of aluminum atoms occurs predominately at grain boundaries.

Accordingly, if grain boundaries are removed out of an aluminum electrode film or if grain boundaries are substantially reduced, that is, if an aluminum electrode film close to a single crystal is achieved, great power-durability improvements are then expectable. As known in the art, one factor of the electric resistance of a electrode film is a scattering of electrons due to grain boundaries. In this regard, too, removal of grain boundaries is preferable because, in the absence of them, there is an electric resistance decrease and, hence, the loss in a surface acoustic wave device decreases.

Application of a substantial single-crystal form of material to an electrode film for a surface acoustic wave device has already been disclosed in JP-A 55-49014. The publication alleges that by use of an electrode material that is substantially a single crystal, it is possible to enhance the performance of a surface acoustic wave device, whatever material is used to make up the device. The publication shows that molecular beam epitaxy is preferred to obtain such an electrode film. However, the publication provides no disclosure of what is used for the substrate material, and how film-forming conditions are determined depending on the electrode material used. That is, what is disclosed therein is nothing else than general consideration to the effect that an improvement in the performance of a surface acoustic wave device is expectable by use of a single-crystal electrode film. Thus, the publication provides no illustrative disclosure of to what degree the Q value, and the aging properties are improved. To add to this, there are several problems in fabricating surface acoustic wave devices at low costs by molecular beam epitaxy. For instance, costly equipment is needed, and the film-forming rate is slow.

One example of applying a single-crystal aluminum film or an aluminum film oriented in a certain crystal alignment direction to an electrode film for a surface acoustic wave device is disclosed in U.S. Pat. No. 2,545,983. Here, a rotated Y-cut quartz substrate in the 25° to 39° rotated Y-cut range is used as a piezoelectric substrate to obtain a (311) oriented film by vapor deposition at a high rate (a deposition rate of 40 Å/sec.) and a low temperature (a substrate temperature of 80° C.). The patent publication states that the film is an epitaxially grown film close to a single-crystal film. In the case of low-temperature vapor deposition, it appears that a problem arises in connection with close contact of the aluminum electrode film with the underlying quartz substrate (film adhesive strength). In this regard, the patent publication suggests that an extremely thin Ti or Cr film is located at the interface between the quartz substrate and the aluminum film to such an extent that the orientation capability of the aluminum film is not inhibited. For RF-band filters where the power-durability of electrode films are a matter of great concern as already mentioned, lithium niobate and lithium tantalate are often used as piezoelectric substrates, because of the magnitude of their electromechanical coupling coefficient. However, the patent publication discloses nothing about the use of lithium niobate and lithium tantalate; it refers merely to the (311) orientation of an aluminum film when quartz is used as a piezoelectric substrate.

JP-A 5-90268 discloses a technique for providing a buffer metal layer on a piezoelectric substrate and forming a thin film form of aluminum or aluminum alloy thereon, and indicates that this structure allows the aluminum or aluminum alloy to show strong (111) orientation. So far, it has been known that the (111) oriented film of aluminum shows strong migration resistance. Consequently, the power-durability of a surface acoustic wave device should be improved by the (111) oriented electrode film. The example given therein teaches that the (111) oriented Al alloy film is obtained by using quartz as the piezoelectric substrate and forming a Ti buffer layer and an Al-0.5 wt % Cu alloy on the substrate in the described order, using a dual ion beam sputtering system. The publication teaches that the degree of the (111) orientation of the Al alloy was found from the strength of X-ray diffraction from the (111) plane, the full-width at half maximum of a rocking curve, etc. Insofar as the data about the widths of X-ray diffraction peaks and the full-widths at half maximum of rocking curves, given in the publication, are concerned, however, it appears that the obtained aluminum alloy is a polycrystalline film oriented strongly in the (111) direction.

The above publication shows an example where lithium niobate useful for making up an RF-band filter is used as the piezoelectric substrate. In this example, vanadium (v), iron (Fe), cobalt (Co), nickel (Ni), copper (Cu), yttrium (Y), chromium (Cr), zinc (Zn), $Fe_{20}Ni_{80}$ alloy, $Ti_{50}V_{50}$ alloy, and $Co_{90}Ni_{10}$ are used as a buffer metal, and 300 Å aluminum is deposited on the buffer metal. The example teaches that the above metal and alloy species except zinc contribute to a decrease in specific resistance and an improvement in orientation capability. However, the obtained film is actually a polycrystalline film with the (111) plane oriented, because the full-widths at half maximum of rocking curves shown therein have a minimum value of 2.1 degrees. A. Kamijo and T. Mitsuzuka disclose similar results in an article, J. Appl. Phys. 77(8), pp. 3799–3804, 1995. From this article, it is found that when films are formed at an extremely low deposition rate by an ion beam sputtering process, for instance, an aluminum film is formed at 0.2 nm/sec. and a buffer metal film is formed at 0.04 to 0.2 nm/sec., an aluminum film strongly oriented in the (111) direction is obtained. However, this aluminum film is a polycrystalline film in the intra-planar direction thereof, and so the resulting electrode film is a polycrystalline film rather than a heteroepitaxial film.

JP-A 5-199062 shows that an aluminum single-crystal film is used as a electrode film for a surface acoustic wave device, and discloses means for forming this aluminum single-crystal film. Here ST-or LST-cut quartz is used as a piezoelectric substrate. The publication alleges that by allowing the surface of this substrate to have an archipelagic structure wherein minute, hemispherical islands are almost uniformly present, it is possible to obtain an aluminum single-crystal film by a vapor deposition or sputtering process. The publication then teaches that a conventional etching process may be used as the technique for processing the surface of the substrate to impart the archipelagic structure thereto. The publication also teaches that a substrate material other than quartz, for instance, lithium niobate useful for making up an RF-band filter, too, is effective for use with this technique for obtaining a single-crystal aluminum film. In this regard, however, the publication discloses nothing about any illustrative example and data.

JP-A 6-132777 discloses another prior art regarding an aluminum single-crystal film. The publication teaches that when a film is formed on an extremely thin and clean crystal plane at an extremely low deposition rate, an aluminum single-crystal film is obtained, and shows some examples wherein an aluminum single-crystal film may be formed on an LST-cut quartz substrate by a vacuum vapor deposition process, an aluminum single-crystal film may be formed on a 128° Y-cut lithium niobate substrate by a vacuum vapor deposition process, and an aluminum single-crystal film may be formed on a 112° X-cut lithium tantalate substrate by a vacuum vapor deposition process. Incidentally, the publication teaches that if the surface of the substrate is contaminated, no single-crystal film is then obtained. As the deposition rate becomes slow, there is generally an increase in the probability of impurities, i.e., contaminant atoms arriving at, and being captured by, the surface of the substrate. It is thus expected that too slow a deposition rate makes it difficult to obtain a single-crystal film. Unless the degree of vacuum of an atmosphere during deposition and the deposition rate are placed under precise control, it is then impossible to obtain a single-crystal film with high reproducibility. Thus, some problems arise in connection with mass production. To obtain a single-crystal film, it is important to reduce the kinetic energy of aluminum atoms arriving at the surface of the substrate. To reduce the energy of the aluminum atoms, it is then required to achieve proper control of the temperature of evaporation of an evaporation source and the temperature at which the substrate to be provided with a film is heated, rather than the deposition rate depending on the makeup of a deposition system. However, the above publication is silent about these considerations.

As explained with reference to the prior publications, the power-durability of the aluminum electrode film used in the surface acoustic wave device becomes a matter of great concern. As the means for solving this problem, the following three methods have so far been proposed: one method where the electrode film is formed of an alloy, another method where the electrode film is formed of a film oriented in the (111) direction, and yet another method where the electrode film is formed of a single-crystal film. However, the alloy electrode film suffers from an increase in the loss in the surface acoustic wave device, which has an inevitable relation to an electric resistance increase. On the other hand, the electrode film formed of the film oriented in the (111) direction is improved in terms of power-durability due to the (111) orientation. However, it is impossible to achieve outstanding prevention of migration of aluminum atoms at grain boundaries, because too many grain boundaries are still present in the electrode film. In contrast to the above two electrode films, the single-crystal electrode film is free from migration of aluminum atoms at grain boundaries because there are no grain boundaries, and can have decreased electric resistance. Thus, this single-crystal film may be best suited for use as a power-durable electrode material. However, the single-crystal film forming techniques disclosed in the above referred-to publications have several grave problems. For instance, the deposition system used costs much, the deposition rate is too slow for mass fabrication of surface acoustic wave devices, and the substrate used is limited to quartz. Especially in the case of lithium niobate best suited for making up an RF-band filter where the power-durability of an electrode film is a matter of great concern, in particular a 64° rotated Y-cut lithium niobate piezoelectric substrate, how an aluminum electrode film is converted into a single-crystal film, and how a single-crystal aluminum electrode film is fabricated remains still unclarified.

When it is difficult to form a single-crystal aluminum electrode film, on the other hand, an aluminum, polycrystalline electrode film showing high (111) orientation is useful in view of power-durability. As already mentioned, it is reported that a (111) polycrystalline film showing high orientation is obtainable by forming a buffer metal on a piezoelectric substrate and forming an aluminum electrode film thereon. When 36° rotated Y-cut lithium tantalate useful for making up an RF-band filter is used as the piezoelectric substrate to achieve high (111) orientation capability, what type of buffer film should be used, and at what thickness and under what conditions the buffer film should be formed remains still unclarified.

DISCLOSURE OF THE INVENTION

An object of the invention is to provide at low cost a surface acoustic wave device comprising a 64° rotated Y-cut lithium niobate piezoelectric substrate and an electrode film formed thereon, which film comprises an aluminum single-crystal excellent in power-durability.

Another object of the invention is to provide a surface acoustic wave device comprising a 36° rotated Y-cut lithium tantalate piezoelectric substrate and an electrode film formed thereon, which film comprises an aluminum film showing high (111) orientation capability.

The above objects are achievable by the inventions defined below as (1) to (5).

(1) A surface acoustic wave device comprising a 64° rotated Y-cut lithium niobate piezoelectric substrate and an interdigital electrode formed thereon, characterized in that said interdigital electrode comprises a titanium buffer metal film and an aluminum film formed thereon, both said titanium buffer metal film and said aluminum film being a single-crystal film that manifests itself in a spot form alone upon selected-area electron diffraction.

(2) The surface acoustic wave device according to (1), wherein said titanium buffer metal film has a normal direction of a (001) plane thereof vertical to said substrate, and said aluminum film has a normal direction of a (110) plane thereof or a plane crystallographically equivalent thereto vertical to said substrate.

(3) A process of fabricating a surface acoustic wave device comprising steps of using 64° rotated Y-cut lithium niobate as a piezoelectric substrate and providing a titanium buffer metal film on said substrate, said titanium buffer metal film being a single-crystal film that manifests itself in a spot form alone upon selected-area electron diffraction; forming an aluminum film on said titanium buffer metal film, said aluminum film being a single-crystal film that manifests itself in a spot form alone upon selected-area electron diffraction; and forming a multilayer film comprising said titanium buffer metal film and said aluminum film in an interdigital electrode configuration.

(4) A surface acoustic wave device comprising a 36° rotated Y-cut lithium tantalate piezoelectric substrate and an interdigital electrode formed thereon, characterized in that:

said interdigital electrode comprises a titanium buffer metal film and an aluminum film formed thereon, said titanium buffer metal film having a thickness of at least 330 Å, and said aluminum film being a polycrystalline film oriented in a (111) direction thereof, with a rocking curve full-width at half maximum of a (111) peak thereof being 2.1 degrees or lower upon X-ray diffraction.

(5) A process of fabricating a surface acoustic wave device comprising steps of using 36° rotated Y-cut lithium tantalate as a piezoelectric substrate and providing a titanium buffer metal film of at least 330 Å in thickness on said substrate; forming an aluminum film on said titanium buffer metal film, said aluminum film being a polycrystalline film oriented in a (111) direction thereof, with a rocking curve full-width at half maximum of a (111) peak thereof being 2.1 degrees or lower upon X-ray diffraction; and forming a multilayer film comprising said titanium buffer metal film and said aluminum film in an interdigital electrode configuration.

Through experimentation and examination, the inventors have now found that an aluminum (Al) film is formed on a lithium niobate piezoelectric substrate, especially a 64° rotated Y-cut substrate using titanium (Ti) as a buffer metal film, thereby obtaining a single-crystal film wherein the normal direction of the (001) crystal plane or c plane of the titanium buffer metal film is vertical to the substrate, and the normal direction of the (110) crystal plane of the aluminum film is vertical to the substrate. According to a surface acoustic wave device wherein the thus formed aluminum single-crystal electrode film is used as an electrode film, the power-durability of the electrode film can be much more increased than ever before. When the 36° rotated Y-cut lithium tantalate is used as the piezoelectric substrate, it is possible to provide the titanium buffer metal film thereon, thereby obtaining a high orientation, polycrystalline film wherein the rocking curve full-width at half maximum of the (111) peak for aluminum is 2.1 degrees or lower.

BEST MODE FOR CARRYING OUT THE INVENTION

Figure 1:
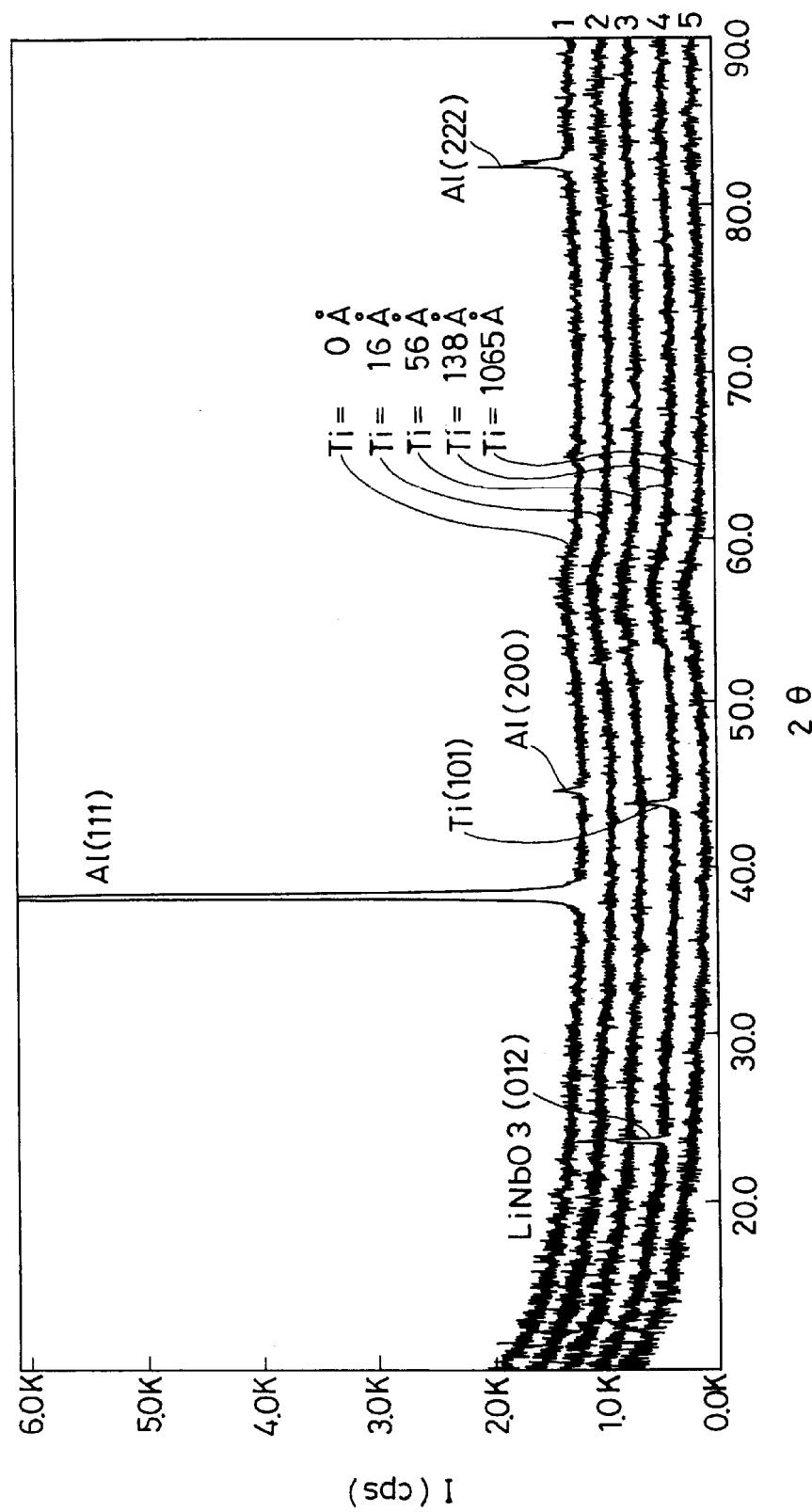
FIG. 1 is a chart showing changes in the X-ray diffraction pattern for an aluminum film with respect to changes in the thickness of a titanium buffer metal film when 64° rotated Y-cut lithium niobate is used as the substrate according to the invention.

The surface acoustic wave device according to the first aspect of the invention comprises a 64° rotated Y-cut lithium niobate piezoelectric substrate and at least one pair of interdigital electrodes (comb electrode) formed on the surface of the substrate. The pair of interdigital electrodes comprise a titanium buffer metal film provided on the substrate and an aluminum film formed on the titanium buffer metal film.

The above piezoelectric substrate is formed using a conventional 64° rotated Y-cut lithium niobate single crystal. The cut direction of the substrate may be confirmed by X-ray diffraction. Generally but not exclusively, the size of the substrate, when applied to a surface acoustic wave device, is of the order of 2 to 10 mm in a surface acoustic wave propagation direction and of the order of 1 to 4 mm in a direction perpendicular thereto, and the thickness of the substrate is of the order of 0.2 to 0.4 mm. However, it is to be noted that at an electrode-forming step a round substrate of 2 inches or 3 inches in diameter is usually employed, and the above elements of the above sizes are formed together on the round substrate.

Referring here to the above titanium buffer metal film, the purity of titanium therein should preferably be as high as possible. However, it is acceptable to use a titanium buffer metal film having a titanium purity of at least 99.9%. In order to obtain a uniform film, the thickness of the titanium buffer metal film should preferably be at least 10 Å. Preferably but not exclusively, the upper limit to the thickness of the titanium buffer metal film is about 1 $\mu$m or lower, because as the titanium buffer metal film becomes thick, it is likely to crack or exfoliate due to increased internal stress.

The titanium buffer metal film may be provided on the substrate by a vapor deposition process, a sputtering process or the like. The deposition rate for the titanium buffer metal film should preferably be of the order of 0.1 to 10 Å/sec. in view of thickness control.

The titanium buffer metal film according to the first aspect of the invention is a single-crystal film wherein the normal direction of the (001) plane is vertical to the substrate. This may be confirmed by relative position relationships among spots upon selected-area electron diffraction.

The aluminum film may be formed on the titanium buffer metal film by a vapor deposition process, a sputtering process or the like. The deposition rate for the aluminum film should preferably be of the order of 10 to 50 Å/sec. The thickness of the aluminum film may be determined depending on the frequency band applied, etc. However, it is generally preferable that the thickness of the aluminum film is determined in the range of 10 Å to 3 $\mu$m inclusive, for the same reasons as explained in conjunction with the titanium buffer metal film.

The aluminum film according to the first aspect of the invention is a single-crystal film wherein the normal direction of the (110) plane or a plane crystallographically equivalent thereto is vertical to the substrate. Whether or not the normal direction of the (110) plane of an aluminum crystal or a plane crystallographically equivalent thereto is vertical to the substrate may be confirmed from relative position relationships among spots on selected-area electron diffraction.

The surface acoustic wave device according to the second aspect of the invention comprises 36° rotated Y-cut lithium tantalate as a piezoelectric substrate, and at least one pair of interdigital electrodes formed on the surface of the substrate. The interdigital electrodes comprise a titanium buffer metal film provided on the substrate and an aluminum film formed on the titanium buffer metal film.

The above piezoelectric substrate may be made up of a conventional 36° rotated Y-cut lithium tantalate single crystal. The cut direction of the substrate may be confirmed by X-ray diffraction. Usually but not exclusively, the size of the substrate is the same as explained in conjunction with the first aspect of the invention. In the following explanation of the second aspect of the invention, the same as in the first aspect of the invention will not be explained.

The titanium buffer metal film according to the second aspect of the invention must have a thickness of at least 330 Å. If this thickness condition is satisfied, it is then possible to form a high-orientation (111), polycrystalline aluminum film on the titanium buffer metal film. The total thickness of the electrode film may be determined depending on the frequency applied to a surface acoustic wave device. However, it is usually preferable to use a film thickness of up to about 10%, normalized by a surface acoustic wave wavelength.

The aluminum film formed on the titanium buffer metal film according to the second aspect of the invention is made up of a polycrystalline film oriented in the (111) direction. In this aluminum film, the rocking curve full-width at half maximum of the (111) peak upon X-ray diffraction is 2.1 degrees or lower. Even with a polycrystalline film rather than a single-crystal film, it is possible to obtain an electrode having power-durability as high as that of the single-crystal film, if the polycrystalline film shows high orientation as represented by the full-width at half maximum 5 of 2.1 degrees or lower.

The width of electrode fingers of the interdigital electrode made up of a multilayer film comprising the above titanium buffer metal film and aluminum film may be selected depending on the frequency used with a surface acoustic wave device. For instance, this width is generally of the order of 2 to 10 $\mu$m at a frequency band of 10 to 500 MHz.

The processes of fabricating the surface acoustic wave devices according to the invention will no longer be explained, because they are the same as a conventional fabrication process with the exception of the formation of the above titanium buffer metal film.

EXAMPLE

The surface acoustic wave devices of the invention are now explained in more detail with reference to some examples.

First of all, 64° rotated Y-cut lithium niobate (64LN for short), 36° rotated Y-cut lithium tantalate (36LT for short), and (100) Si substrates were prepared as substrates for forming electrode films thereon. Then, each substrate was washed in the order of ultrasonic washing with a neutral detergent solution, rinsing with pure water, ultrasonic washing with isopropyl alcohol, ultrasonic washing with acetone, ultrasonic washing using again isopropyl alcohol, and rinsing with pure water, and finally dried. For film deposition, an electron beam vapor deposition system was herein used. It is noted, however, that a sputtering system or the like may be used for an arrangement where a double-layer film can be obtained. Materials used for film deposition were aluminum with 99.999% purity, and titanium with 99.99% purity. The degree of vacuum reached during vapor deposition was $1.0\times10^{-4}$ Pa, and each substrate was heated at 100 to 150° C. The deposition rate was about 30 Å/sec. for aluminum, and as low as about 1 Å/sec. for titanium in view of ease of thickness control, because it was required to provide titanium in an extremely thin film form.

For the purpose of examining the effect of the titanium buffer metal film, each of the above three substrates was used to make a titanium buffer metal film-free sample (i.e., a sample consisting of an aluminum layer alone), and samples with titanium buffer metal films varying in thickness. As a result of thickness measurement, the titanium buffer metal films were found to have a thickness of 16 Å, 56 Å, 138 Å, and 1,065 Å, respectively. On each titanium buffer metal film an aluminum film was formed at a thickness of 1,800 Å. Herein, the thicknesses of the titanium buffer metal films, and the aluminum film were measured by the fluorescent X-ray method. The thus prepared electrode films were inspected by X-ray diffraction. The results are shown in FIG. 1, FIG. 2, and FIG. 14.

FIG. 1 is a chart with X-ray diffraction patterns drawn in the same coordinate axes, said X-ray diffraction patterns found for an aluminum film formed on a 64LN substrate with no titanium buffer metal film formed thereon, and aluminum films formed on titanium buffer metal films with varying thicknesses, each provided on an 64LN substrate. It is found from FIG. 1 that, in the absence of the titanium buffer metal film, the aluminum film is strongly oriented in the (111) direction. In the presence of the titanium buffer metal films, however, the (111) orientation of aluminum vanishes. Irrespective of the thicknesses of the titanium buffer metal films in the thickness range under examination according to the invention, the peak for aluminum vanishes. On the X-ray diffraction patterns in the presence of the titanium buffer metal films, only the LiNbO$_3$ substrate shows a peak. As discussed in the aforesaid JP-A 6-132777, the fact that no diffraction peak for the aluminum crystal plane is found whatsoever implies the possibility that aluminum is converted into a single crystal of good quality. In this regard, however, it is to be noted that the estimation of a single-crystal film by X-ray diffraction alone is somewhat lacking in reliability because, although depending on measuring conditions, an extremely sharp peak is sometimes observed even in the case of a single crystal of good quality.

Figure 14:
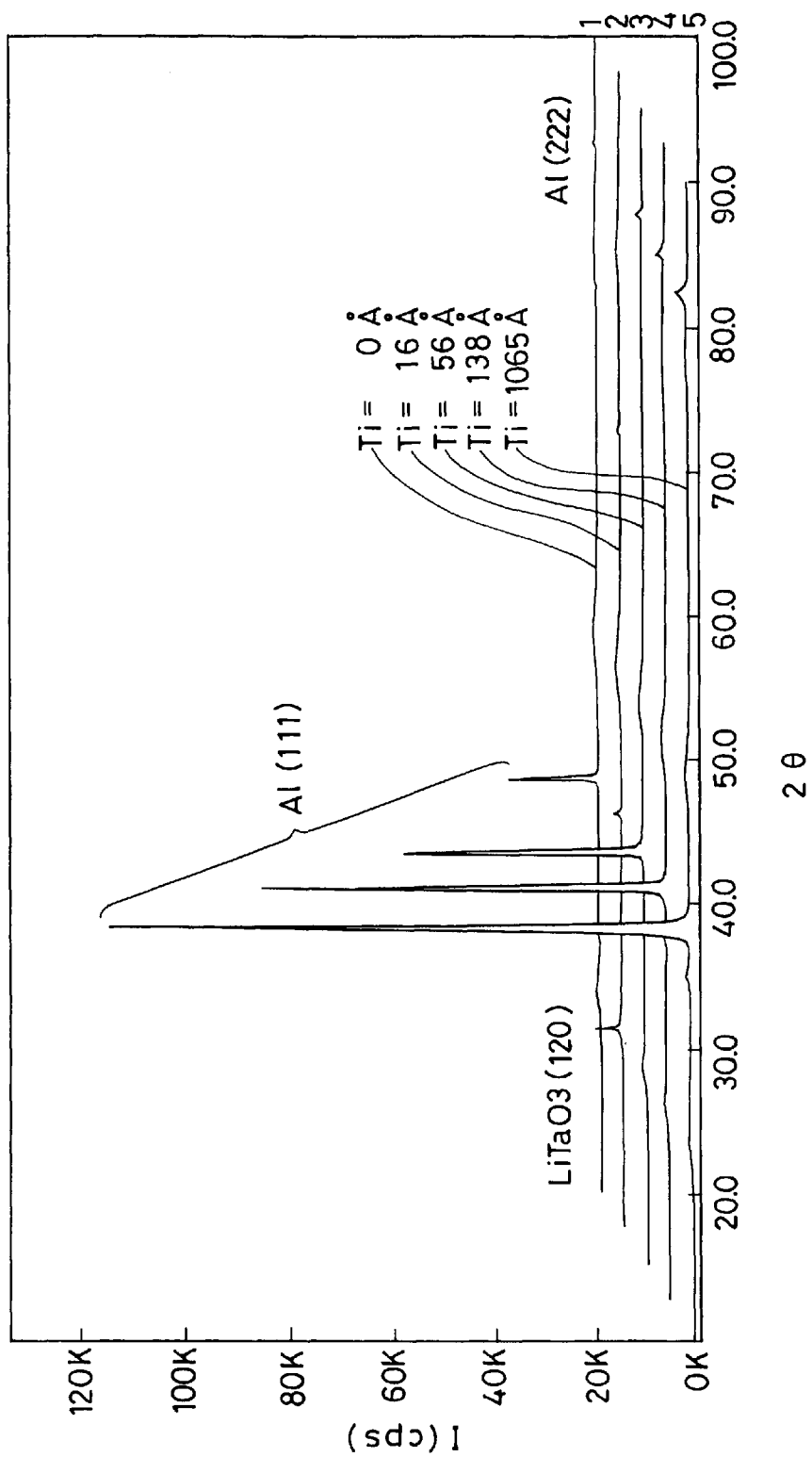
FIG. 14 is a chart showing changes in the X-ray diffraction pattern for an aluminum film with respect to changes in the thickness of a titanium buffer metal film when 36° rotated Y-cut lithium tantalate is used as the substrate according to the invention.

FIG. 14 is a chart showing X-ray diffraction patterns for aluminum films on the 36LT substrates. To prevent peaks from overlapping each other on the drawing, the horizontal axes are shifted little by little. From FIG. 14, it is found that in contrast to the 64LN substrates, the aluminum (111) orientation is more reinforced with an increasing thickness of the titanium buffer metal film, so that a polycrystalline aluminum film strongly oriented in the (111) direction can be obtained, as already discussed in the aforesaid publication JP-A 5-90268.

Figure 2:
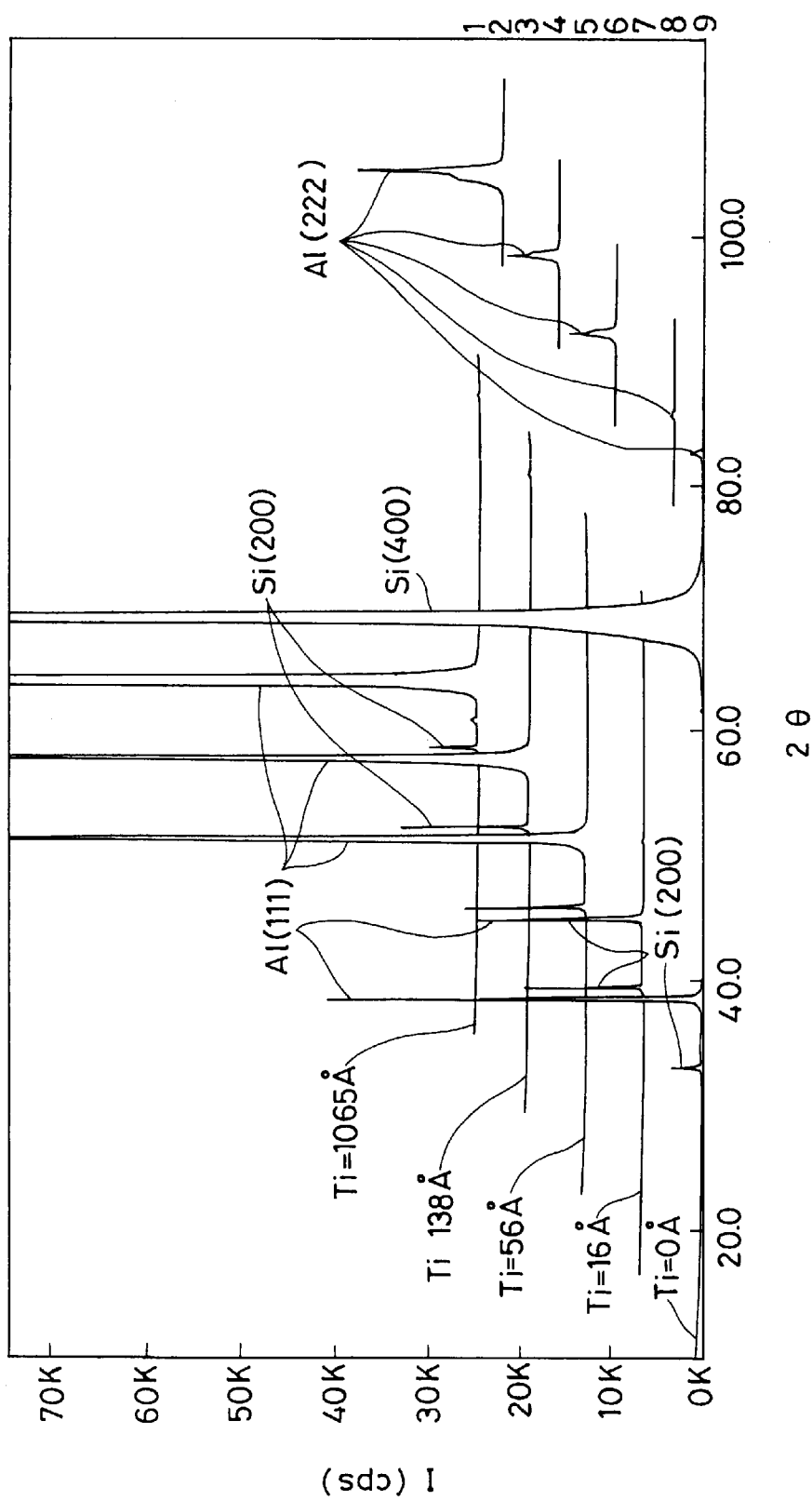
FIG. 2 is a chart showing changes in the X-ray diffraction pattern for an aluminum film with respect to changes in the thickness of a titanium buffer metal film when (100) Si is used as the substrate.

FIG. 2 is a chart showing the results of similar X-ray diffraction in the case of Si substrates. In this case, too, the horizontal axes are shifted little by little to prevent peaks from overlapping each other. It was found that the substrate sample with no titanium buffer metal layer formed thereon produces a very strong (400) peak for Si. Thus, the remaining four samples were measured, skipping the angle out of which this Si (400) peak emerged. As can be seen from FIG. 2, the aluminum (111) orientation is more reinforced with an increasing thickness of the titanium buffer metal film, so that a polycrystalline aluminum film strongly oriented in the (111) direction can be obtained.

Figure 11:
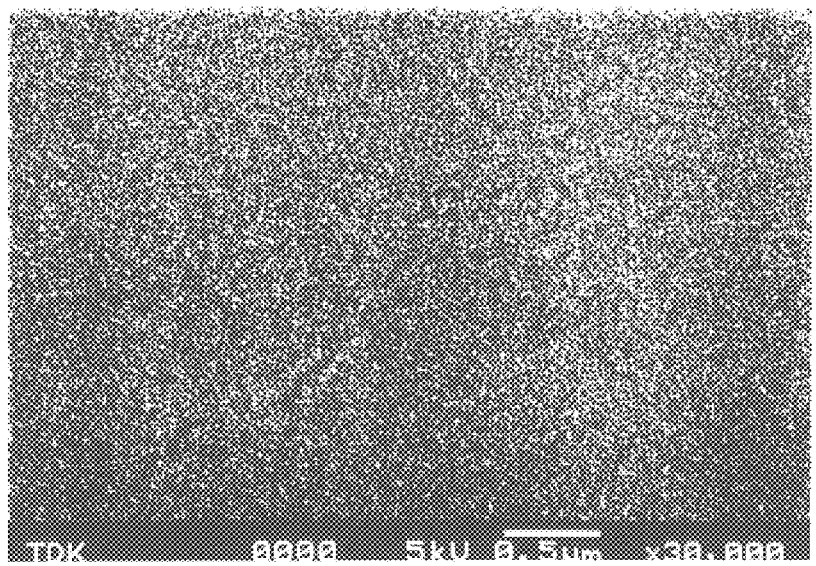
FIG. 11 is a drawing substitute photograph showing a grain structure, i.e., a scanning electron microscope photograph of the surface of an aluminum film formed on a 64° rotated Y-cut lithium niobate substrate with a titanium buffer metal film interleaved between them.
Figure 12:
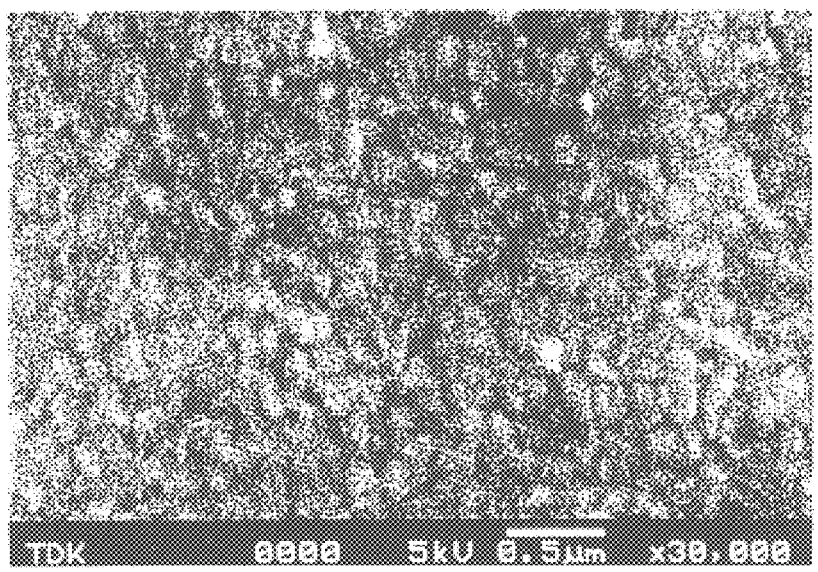
FIG. 12 is a drawing substitute photograph showing a grain structure, i.e., a scanning electron microscope photograph of the surface of an aluminum film formed directly on a 64° rotated Y-cut lithium niobate substrate.
Figure 13:
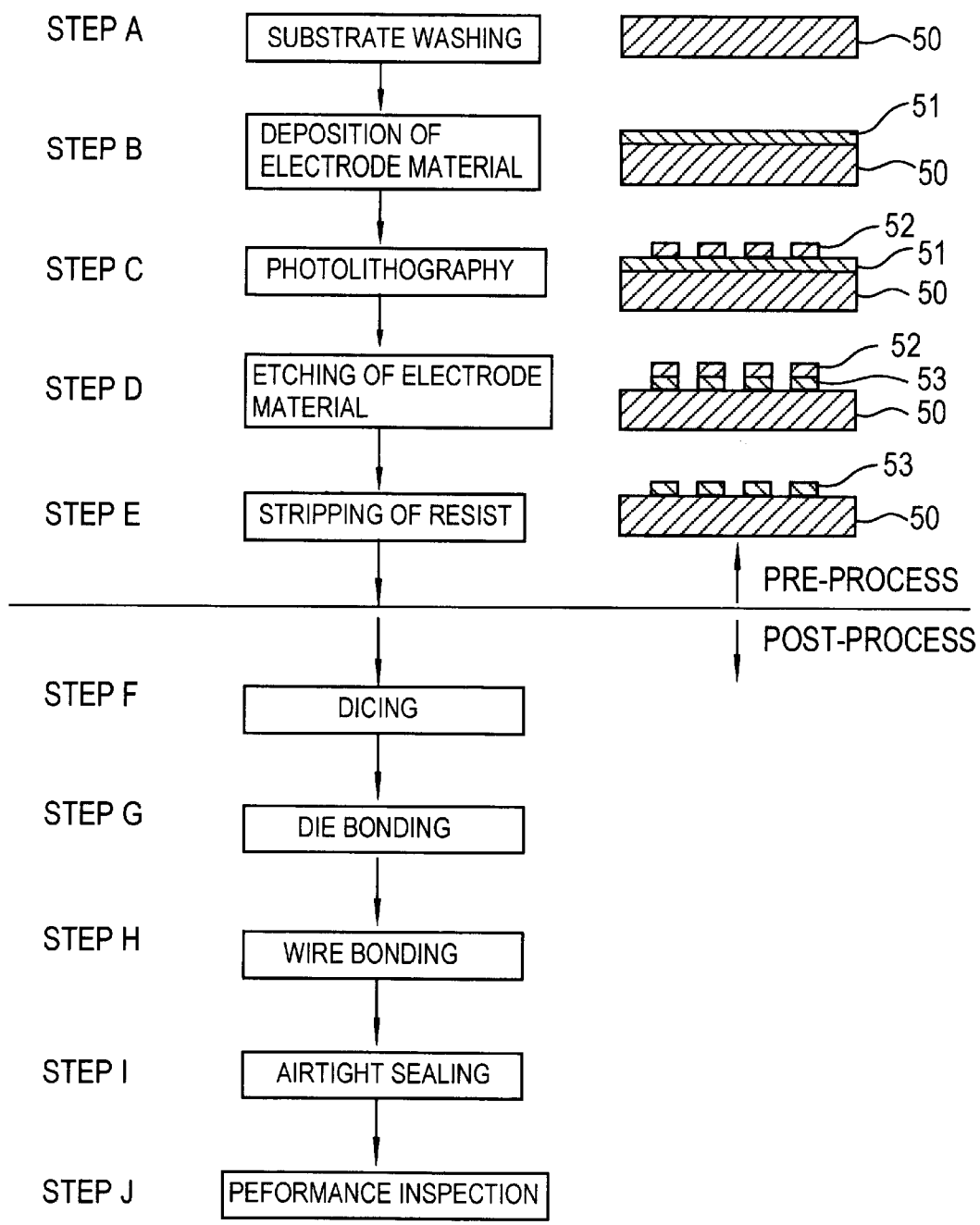
FIG. 13 illustrates a process sequence of steps of fabricating a surface acoustic wave device.

The aluminum film of each sample was observed for its surface state under a scanning electron microscope (SEM). Consequently, when the substrates were made up of 36LT, and Si, the existence of crystal grains was confirmed regardless of the presence or absence of the titanium buffer metal films. When the substrates were made of 64LN, however, some noticeable changes were observed depending the presence or absence of the titanium buffer metal films. In other words, when the titanium buffer metal films were provided, it was found that within the thickness range under experimentation and investigation, all the aluminum films have a very smooth surface with no crystal grains at all. A scanning electron microscope photograph of a typical aluminum film with no crystal grains found thereon is attached hereto as FIG. 11. This aluminum film of 1,800 Å in thickness was formed on the titanium buffer metal film of 56 Å in thickness. For comparison purposes, a similar photograph was also taken of a sample having no titanium buffer metal film, i.e., having an aluminum film of 1,800 Å in thickness formed directly on a substrate. This photograph is attached hereto as FIG. 12. FIG. 12 shows clearly grain boundaries whereas FIG. 11 shows no grain boundaries whatsoever.

As already mentioned, the estimation of single-crystal films by X-ray diffraction pattern analysis is somewhat lacking in reliability. For this reason, selected-area electron diffraction experimentation often used for the estimation of single-crystal films was performed. Selected-area electron diffraction patterns for a typical sample having no crystal grains, and a typical sample having crystal grains are shown in FIG. 3, and FIG. 5, respectively.

Figure 3:
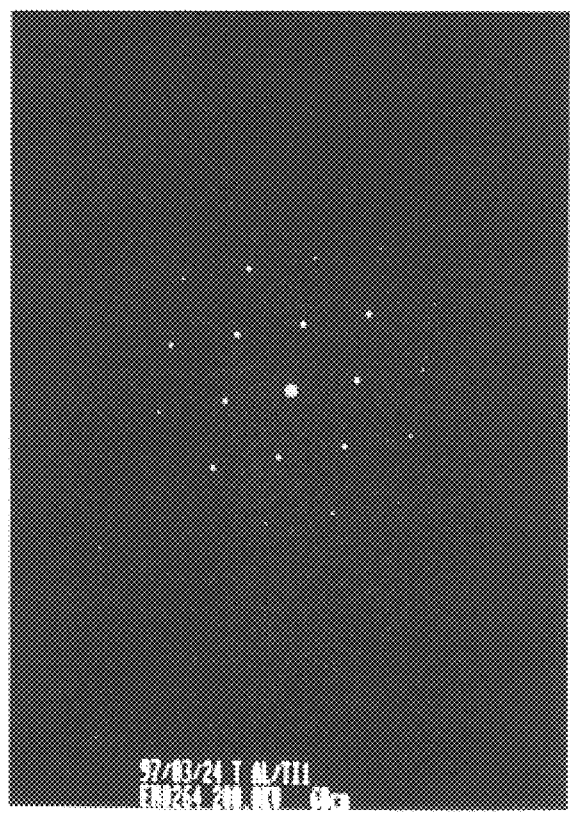
FIG. 3 is a drawing substitute photograph showing a selected-area electron diffraction pattern for a single-crystal aluminum film according to the invention.

FIG. 3 shows a typical sample where spots manifest themselves upon selected-area electron diffraction. In this sample, an aluminum film of 1,800 Å in thickness was formed on a titanium buffer metal film of 56 Å in thickness provided on a 64LN substrate. For a sample having a titanium buffer metal film provided on a 64LN substrate, it was confirmed that such spots as shown in FIG. 3 appear on a selected-area electron diffraction image of the aluminum film formed on the surface of the titanium buffer metal film, irrespective of the thickness of the latter. Referring here to RHEED techniques, the criterion of judgment of whether or not a film is converted into a single-crystal film is generally whether or not streaks are found in addition to the emergence of spots. In the selected-area electron diffraction used herein, however, the emergence of spots is in itself the criterion of judgment of whether or not a film is converted into a single-crystal film. In a sample out of those prepared in this experimentation, wherein an aluminum film was formed on a titanium buffer metal film provided on a 64LN substrate, therefore, the aluminum film is estimated to be converted into a single-crystal film.

Figure 4:
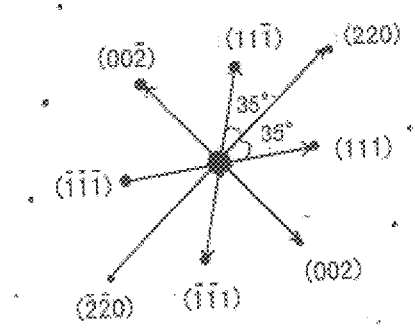
FIG. 4 is a view showing the results of giving plane indices to the selected-area electron diffraction pattern shown in FIG. 3.

On the basis of the spot positions shown in FIG. 3 and the length of a camera inherent in the equipment, plane indices were given to these spots. The results are depicted in FIG. 4. Referring here to FIG. 3, it is to be noted that the direction of incidence of an electron beam aligns with the [1–10] axis direction. Consequently, it was found that the single-crystal aluminum film grows at the (110) plane or a plane crystallographically equivalent thereto.

Figure 5:
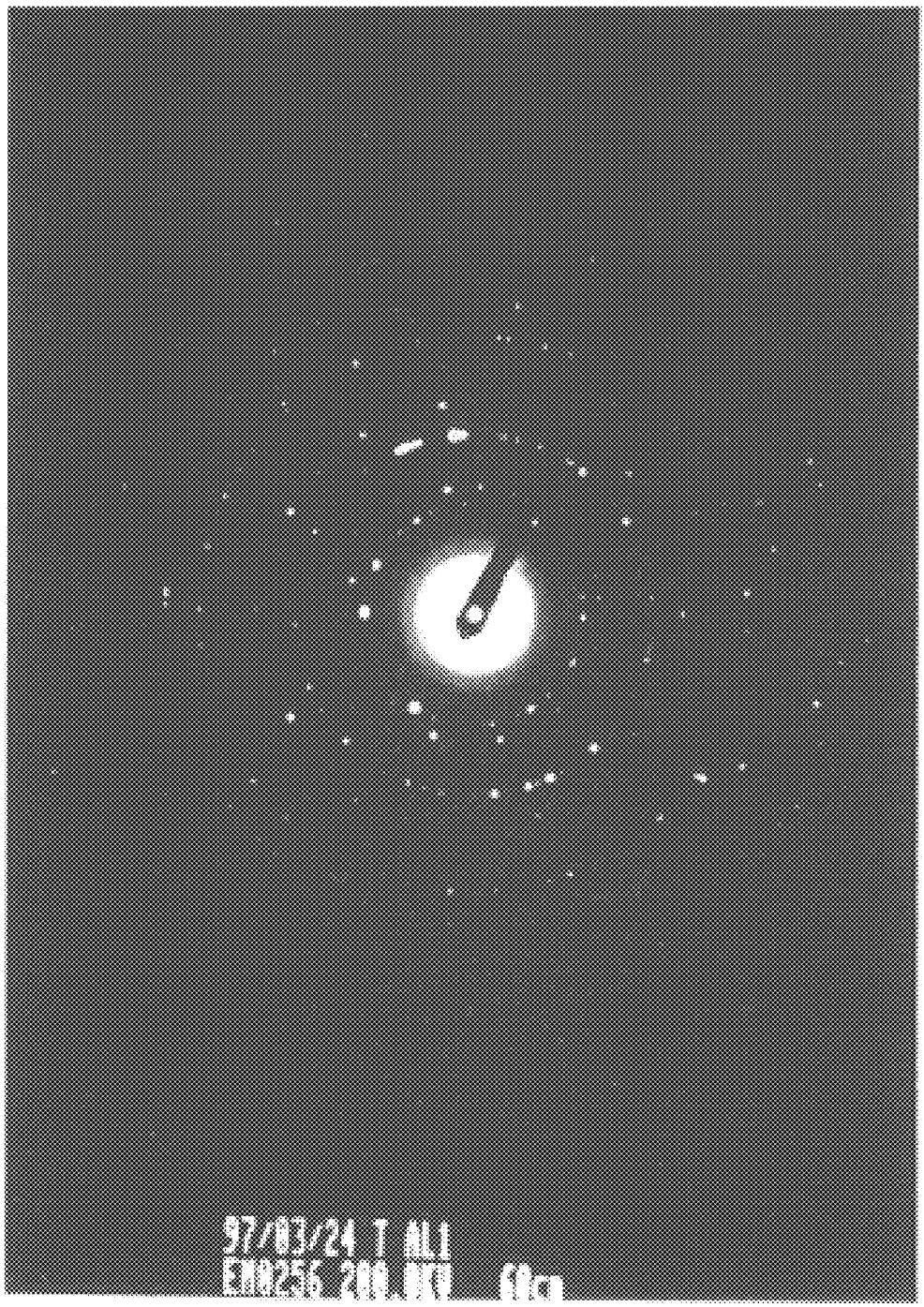
FIG. 5 is a drawing substitute photograph showing a selected-area electron diffraction pattern for a polycrystalline aluminum film.

On the other hand, FIG. 5 shows a typical sample where a ring pattern manifests itself upon selected-area electron diffraction. In this sample, aluminum was deposited on a 64LN substrate having no titanium buffer metal layer thereon. Upon X-ray diffraction, this sample showed a strong (111) orientation. In selected-area electron diffraction analysis, however, the ring pattern was observed, indicating that the aluminum film is a polycrystalline film. Similar analyses of other samples having aluminum films formed on substrates showing the (111) orientation upon X-ray diffraction, i.e., an Si substrate, and a 36LT substrate with or without a titanium buffer metal film indicated that all the aluminum films are more or less made up of polycrystalline aluminum oriented in the (111) direction.

Figure 15:
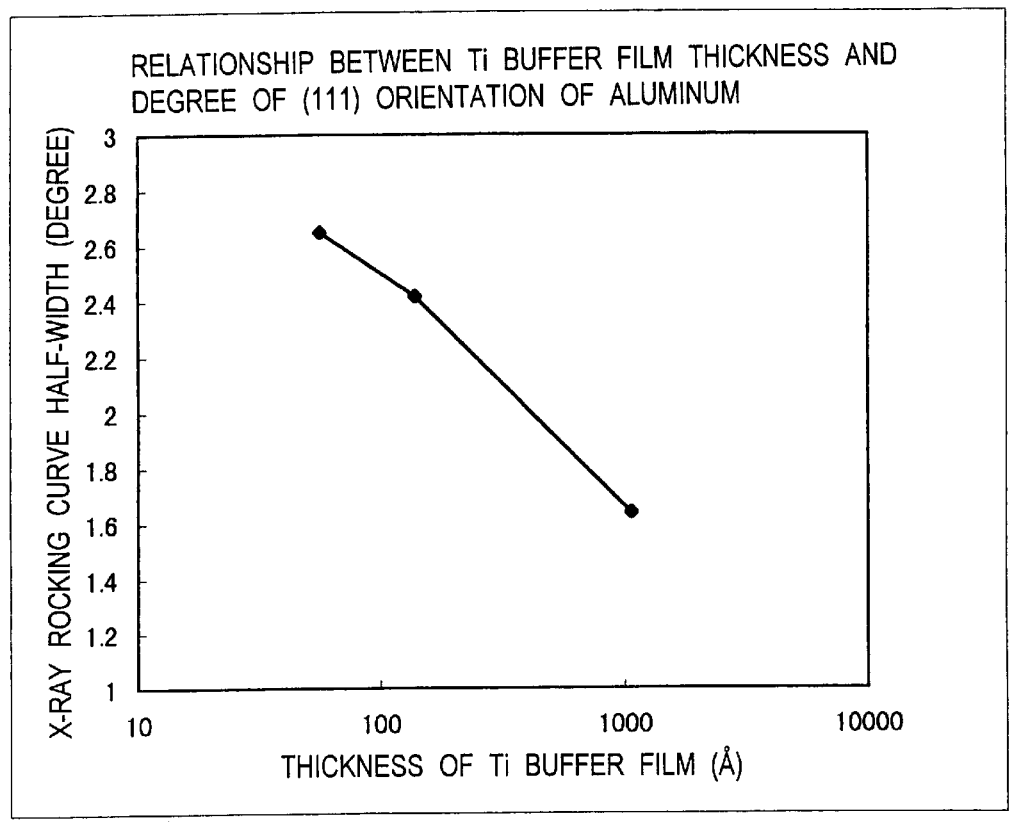
FIG. 15 is a graph showing a relationship between the thickness of a titanium buffer metal film and the degree of (111) orientation of an aluminum film when 36° rotated Y-cut lithium tantalate is used as the substrate.

Incidentally, a 36LT substrate, too, is useful for an RF-band filter substrate because its temperature dependence is superior to that of a 64LN substrate, although its electromechanical coupling coefficient is smaller than that of the 64LN substrate. For this reason, a sample was prepared by providing a titanium buffer metal film on the 36LT substrate and forming an aluminum film thereon. Then, a close examination was made of how the (111) orientation capability of the aluminum film was changed with the thickness of the titanium buffer metal film. The degree of orientation capability was estimated by the rocking curve full-width at half maximum of the (111) peak upon X-ray diffraction, as used in the prior art. The results are plotted in FIG. 15. From these results, it is found that when the 36LT is used as the substrate, the X-ray rocking curve full-width at half maximum of the aluminum (111) peak becomes small with an increasing thickness of the titanium buffer metal film, and becomes almost equal to, or smaller than, the rocking curve full-width at half maximum disclosed so far in the prior art upon the thickness of the titanium buffer metal film exceeding about 330 Å. Stated otherwise, the inventors have demonstrated as a result of experimentation and investigation that an electrode film showing an extremely strong (111) orientation and much more improved in power-durability can be obtained by providing a titanium buffer metal film of at least 330 Å in thickness on a 36° rotated Y-cut lithium tantalate substrate and forming an aluminum film thereon.

Regarding the degree of the (111) orientation of an aluminum film, the aforesaid publication JP-A 5-90268 discloses some illustrative data. The publication teaches that an electrode film fabricated by providing a Cu buffer metal film on a lithium niobate substrate and forming an aluminum film thereon shows the smallest rocking curve full-width at half maximum and, hence, the highest orientation capability, and reports that the thus achieved full-width at half maximum is 2.1 degrees. However, the publication does not disclose any detail of the cut planes of lithium niobate.

Figure 6:
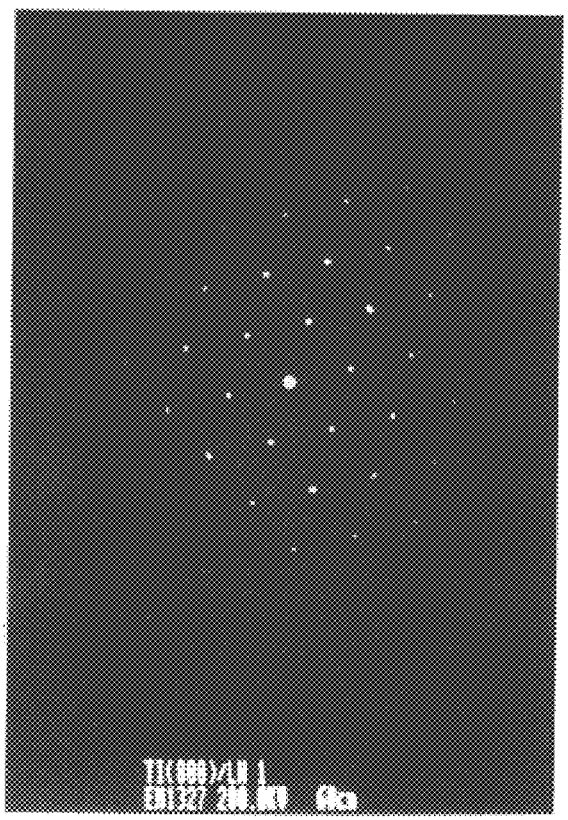
FIG. 6 is a drawing substitute photograph showing a selected-area electron diffraction pattern for a single-crystal titanium buffer metal film according to the invention.
Figure 7:
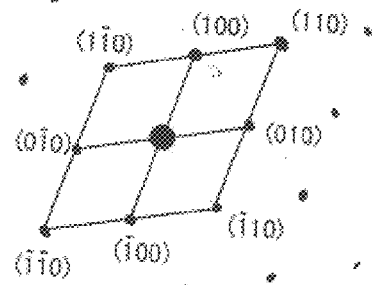
FIG. 7 is a view showing the results of giving plane indices to the selected-area electron diffraction pattern shown in FIG. 6.

For the purpose of searching for why the aluminum film formed on the 64LN substrate with the titanium buffer metal film located between them is converted into a single crystal, selected-area electron diffraction was then performed for a sample having a titanium buffer metal film alone formed on a 64LN substrate. The results are shown in FIG. 6, and FIG. 7 shows plane indices given to the diffraction pattern. Referring to FIG. 6, it is to be noted that the direction of incidence of an electron beam aligns with the [001] axis direction. From FIG. 6, and FIG. 7 it is evident that the titanium buffer metal film provided on the 64LN substrate is converted into a single-crystal film having the normal direction of its own (001) plane, i.e., the c plane vertical to the substrate. FIG. 6 shows the results of the sample having a titanium thickness of 1,065 Å. In similar selected-area electron diffraction of other samples having different titanium thicknesses, too, the emergence of spots alone was observed, indicating that single-crystal films, each having the normal direction of the (001) plane vertical to the substrate, is obtained. From these, a possible mechanism, by which the aluminum single-crystal film can be formed, could be that the (001) plane of the titanium buffer metal film grows heteroepitaxially on the 64LN substrate, and the aluminum film formed on the (001) plane of titanium grows heteroepitaxially at its (110) plane. Although detail position relationships among crystal lattices remain still unclarified, yet the inventors are the first to discover that if a titanium buffer metal film is provided on a 64 LN substrate and an aluminum film is formed on the titanium buffer metal film, it is then possible to convert both the titanium buffer metal film and the aluminum film into single-crystal films.

Then, reference is given to the estimation of power-durability of each of the obtained electrode films, and the results thereof. The surface acoustic wave device used for the estimation of power-durability was of the 3IDT longitudinal coupled double-mode type designed according to the receiving filter specification (center frequency: 947.5 MHz) for a GSM (European portable telephone) system. A 64° rotated Y-cut lithium niobate was used for the piezoelectric substrate, and an interdigital electrode made up of a single-crystal titanium buffer metal film and a single-crystal aluminum film was used for each IDT. Both the single-crystal buffer metal film and the single-crystal aluminum film were deposited using an electron beam vapor deposition system, the former with a thickness of 56 Å and the latter with a thickness of 0.17 μm. Electrode finger width was about 1.2 μm, electrode finger pitch or surface acoustic wave wavelength was 4.64 μm, and the number of pairs of electrode fingers were 17.5 pairs for the center IDT and 11 pairs for each outside IDT.

Likewise, a surface acoustic wave filter of the longitudinal coupled double-mode type was fabricated by providing a titanium buffer metal film of 350 Å in thickness on a 36° rotated Y-cut lithium tantalate piezoelectric substrate, and forming an aluminum film thereon with a thickness of 0.35 μm, said aluminum film being a polycrystalline film which was oriented in the (111) direction and in which the rocking curve full-width at half maximum of its (111) peak was 2.0 degrees. It is here to be noted that the electrode pattern for this filter was the same as used in the filter for which the lithium niobate was used.

Accordingly, the center frequency of the filter made up of the lithium tantalate substrate was shifted to a lower frequency side as compared with that of the GSM receiving side.

Figure 8:
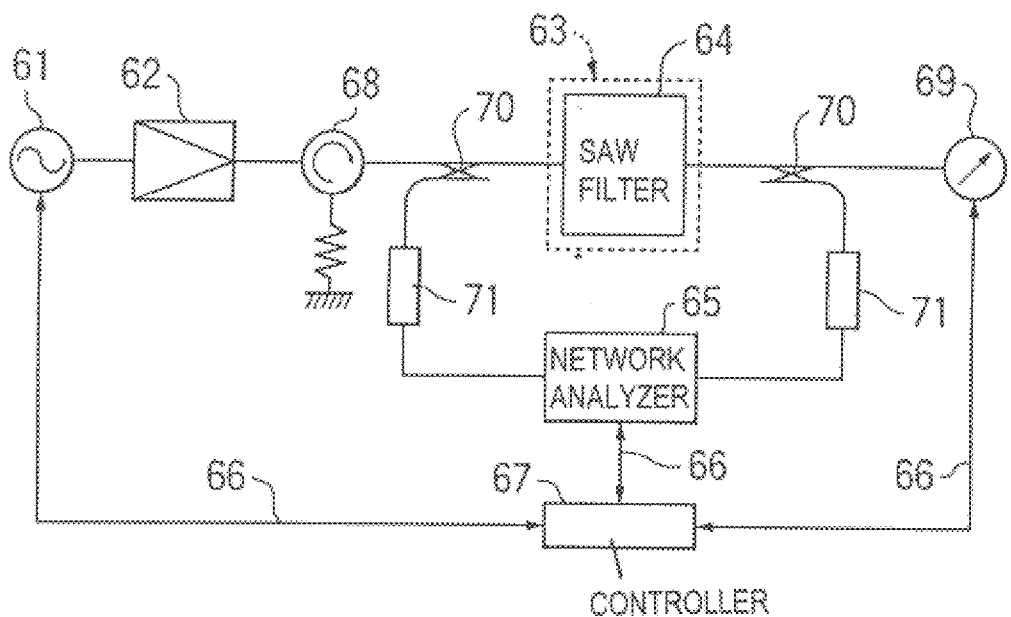
FIG. 8 is a view of a measuring circuit for testing the power-durability of a surface acoustic wave device.

For the purpose of comparison, a sample having an electrode made up of an aluminum polycrystalline film provided directly on the same 64° rotated Y-cut lithium niobate as mentioned above, and a sample using an Al-0.5 wt % Cu alloy, polycrystalline film as an electrode were also prepared. Electrode patterns for these samples, too, were the same as mentioned above. Used for the experimental freuency used for the estimation of power-durability, i.e., for lifetime testing was the frequency which is highest in the passband involved and at which power-durability becomes smallest. The acceleration conditions used were an ambient temperature of 80° C. and an input power of 28 dBm. A measuring circuit used for power-durability experimentation is depicted in FIG. 8. Referring here to FIG. 8, a high-frequency signal generated from an oscillator 61 is amplified by a high-frequency amplifier 62 to 28 dBm, and then applied via an isolator 68 on a surface acoustic wave filter 64 held in an 80° C. thermostatic oven 63. This surface acoustic wave device, i.e., surface acoustic wave filter 64 is connected to a high-frequency wattmeter 69. To measure electrical properties upon the application of power, a network analyzer 65 is connected to both ends of the surface acoustic wave filter 64 via a directional coupler 70 and an attenuator 71. To control the oscillator 61, high-frequency wattmeter 69, and network analyzer 65, a controller 67 is connected to these units by way of a GP-IB cable 66. By definition, the lifetime of the device is here a period of time, TF (the time to failure), in which a 0.5 dB increase is found in the insertion loss of the filter.

Power-durability testing was carried out using the aforesaid estimating system under the aforesaid acceleration conditions, and the results of testing were estimated on the aforesaid criterion of judgment. The lifetime, i.e., TF of the sample, in which the electrode film made up of the single-crystal titanium buffer metal film and the single-crystal aluminum film was formed on the 64LN substrate, was as long as 1,900 hours, and the TF of the sample, in which the polycrystalline aluminum film having high orientation capability and oriented in the (111) direction was formed on the 36LT substrate with the titanium buffer metal film located therebetween, was 170 hours. On the other hand, the TF upon power-durability testing of one comparative sample having the polycrystalline aluminum electrode film formed directly on the 64LN substrate was as short as 0.1 hour while the TF of another comparative sample with the electrode film made up of the Al-0.5 wt % Cu alloy, polycrystalline film was again as short as 2.8 hours. These results revealed that the power-durability of an electrode film having a single-crystal aluminum film formed according to the invention is about 19,000 times as long as that of an electrode film comprising a conventional aluminum polycrystalline film, and about 680 times as long as that of an electrode film comprising an Al0.5 wt % Cu alloy, polycrystalline film proposed so far for power-durability improvements.

Figure 9:
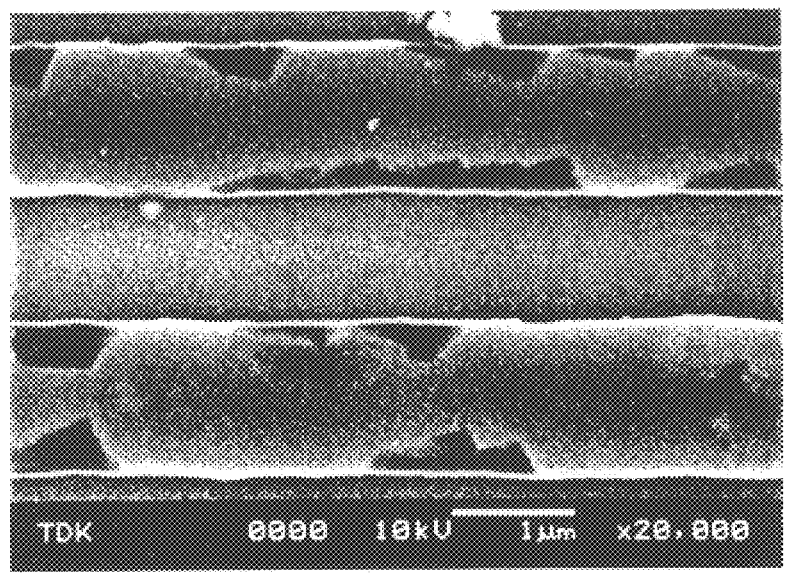
FIG. 9 is a drawing substitute photograph, i.e., a scanning electron microscope photograph showing the state of migration of aluminum atoms in a single-crystal aluminum film-containing electrode film.
Figure 10:
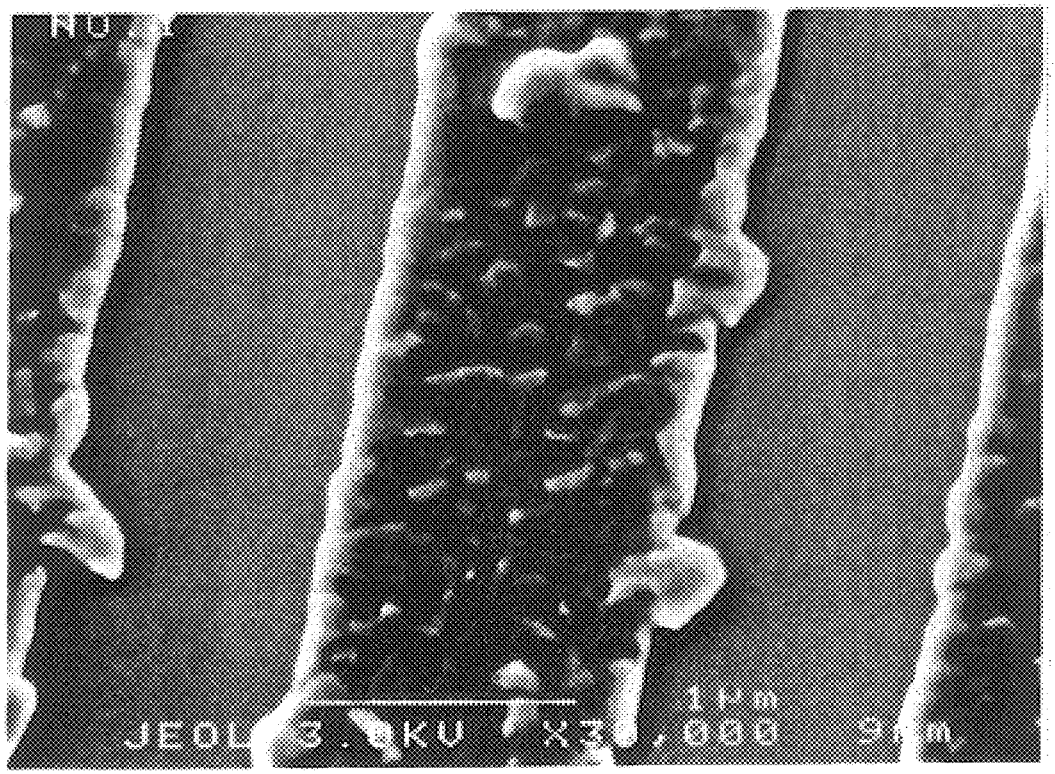
FIG. 10 is a drawing substitute photograph showing a grain structure, i.e., a scanning electron microscope photograph showing the state of migration of aluminum atoms in an electrode film comprising polycrystalline aluminum.

Then, a sample whose performance, i.e., insertion loss was degraded upon the power-durability testing was observed in terms of to what degree the electrode was degraded, using a scanning electron microscope. The results are shown in FIG. 9, and FIG. 10. FIG. 9 shows the results of an inventive sample in which a titanium buffer metal film was provided on a 64° rotated Y-cut lithium niobate substrate and an aluminum film was formed thereon, said titanium buffer metal film, and said aluminum film being a single-crystal film. After the completion of the aforesaid 1,900-hour power-durability testing, the migration of aluminum atoms occurred in the electrode. Although voids are formed due to the migration of aluminum atoms as can be seen from FIG. 9, they assume on a wedged shape characteristic of the migration of aluminum atoms in the single-crystal electrode. The emergence of such wedged voids, too, shows that the aluminum forming the electrode is converted into a single crystal. On the other hand, FIG. 10 illustrates the state of the migration of aluminum atoms in a comparative polycrystalline aluminum electrode film after the power-durability acceleration testing. As can be seen from FIG. 10, voids are formed along grain boundaries. Thus, it appears that the migration of aluminum atoms occurs predominantly in the grain boundaries, as often pointed out in the prior art.

In the foregoing example, the pure-aluminum film was formed on the titanium buffer metal film. However, similar results were obtained even when a trace amount of impurity, e.g., Cu, was added to the aluminum to such an extent that the growth of a single-crystal film is not inhibited. Aluminum was deposited following the example with the exception that the deposition rate of aluminum was 10 Å/sec. In this case, too, a single-crystal aluminum film was obtained as in the example. In the foregoing example, the vacuum vapor deposition process was used for film formation. However, the present invention may also be carried out with other film-formation processes, e.g., a sputtering process.

In a longitudinal coupled double-mode type of surface acoustic wave device fabricated by the prior art technique for making an electrode film power-durable using an Al-0.5 wt % Cu alloy electrode, the insertion loss was about 2.6 dB.

A filter fabricated by forming a single-crystal aluminum film on a single-crystal titanium buffer metal film according to the invention, on the other hand, was found to have an insertion loss of 2.4 dB. In terms of loss, too, a 0.2 dB improvement was achieved.

UTILIZATION OF THE INVENTION IN INDUSTRY

The surface acoustic wave device of the invention uses an electrode having satisfactory power-durability, and so is effective for increasing the lifetime of filters, for which fine comb electrodes must be used, e.g., RF-band filters used with mobile communications equipment.

What we claim is:

1. A surface acoustic wave device comprising a 64° rotated Y-cut lithium niobate piezoelectric substrate and an interdigital electrode formed thereon, characterized in that said interdigital electrode comprises a titanium buffer metal film and an aluminum film formed thereon, both said titanium buffer metal film and said aluminum film being a single-crystal film that manifests itself in a spot form alone upon selected-area electron diffraction.

2. The surface acoustic wave device according to claim 1, wherein said titanium buffer metal film has a normal direction of a (001) plane thereof vertical to said substrate, and said aluminum film has a normal direction of a (110) plane thereof or a plane crystallographically equivalent thereto vertical to said substrate.

3. A process of fabricating a surface acoustic wave device, the process comprising using 64° rotated Y-cut lithium niobate as a piezoelectric substrate and providing a titanium buffer metal film on said substrate, said titanium buffer metal film being a single-crystal film that manifests itself in a spot form alone upon selected-area electron diffraction;

forming an aluminum film on said titanium buffer metal film, said aluminum film being a single-crystal film that manifests itself in a spot form alone upon selected-area electron diffraction;

forming a multilayer film comprising said titanium buffer metal film and said aluminum film in an interdigital electrode configuration; and forming the surface acoustic wave device of claim 1.

4. A surface acoustic wave device comprising a 36° rotated Y-cut lithium tantalate piezoelectric substrate and an interdigital electrode formed thereon, characterized in that:

said interdigital electrode comprises a titanium buffer metal film and an aluminum film formed thereon, said titanium buffer metal film having a thickness of at least 330 Å, and said aluminum film being a polycrystalline film oriented in a (111) direction thereof, with a rocking curve full-width at half maximum of a (111) peak thereof being 2.1 degrees or lower upon X-ray diffraction.

5. A process of fabricating a surface acoustic wave device, the process comprising using 36° rotated Y-cut lithium tantalate as a piezoelectric substrate and providing a titanium buffer metal film of at least 330 Å in thickness on said substrate;

forming an aluminum film on said titanium buffer metal film, said aluminum film being a polycrystalline film oriented in a (111) direction thereof, with a rocking curve full-width at half maximum of a (111) peak thereof being 2.1 degrees or lower upon X-ray diffraction;

forming a multilayer film comprising said titanium buffer metal film and said aluminum film in an interdigital electrode configuration; and forming the surface acoustic wave device of claim 4.

6. The surface acoustic wave device according to claim 1, wherein said titanium buffer metal film has a thickness in a range from 10 Å to 1 μm.

7. The surface acoustic wave device according to claim 1, wherein said titanium buffer metal film has a purity of at least 99.9%.

8. The surface acoustic wave device according to claim 1, wherein said aluminum film has a thickness in a range from 10 Å to 3 μm.

* * * * *